(12) United States Patent
Chakraborty et al.

(10) Patent No.: US 11,680,331 B2
(45) Date of Patent: Jun. 20, 2023

(54) METHOD FOR THE MANUFACTURE OF A COATED STEEL SHEET

(71) Applicant: ArcelorMittal, Luxembourg (LU)

(72) Inventors: Anirban Chakraborty, Saint John, IN (US); Pascal Bertho, Maizières-lès-Metz (FR); Hassan Ghassemi-Armaki, Schererville, IN (US); Christian Allely, Metz (FR); Tiago Machado Amorim, Longeville les Metz (FR)

(73) Assignee: ArcelorMittal, Luxembourg (LU)

( * ) Notice: Subject to any disclaimer, the term of this patent is extended or adjusted under 35 U.S.C. 154(b) by 145 days.

(21) Appl. No.: 16/754,011

(22) PCT Filed: Oct. 19, 2018

(86) PCT No.: PCT/IB2018/058155
§ 371 (c)(1),
(2) Date: Apr. 6, 2020

(87) PCT Pub. No.: WO2019/082036
PCT Pub. Date: May 2, 2019

(65) Prior Publication Data
US 2020/0399774 A1    Dec. 24, 2020

(30) Foreign Application Priority Data
Oct. 24, 2017    (WO) .................. PCT/IB2017/001288

(51) Int. Cl.
*C25D 3/22*    (2006.01)
*B32B 15/01*    (2006.01)
(Continued)

(52) U.S. Cl.
CPC ................ *C25D 3/22* (2013.01); *B23K 11/11* (2013.01); *B32B 7/05* (2019.01); *B32B 15/012* (2013.01);
(Continued)

(58) Field of Classification Search
None
See application file for complete search history.

(56) References Cited

U.S. PATENT DOCUMENTS 4,569,731 A * 2/1986 Matsuda ................ C25D 3/565
205/141
5,441,628 A * 8/1995 Tasaki ..................... C23C 30/00
205/101
(Continued)

FOREIGN PATENT DOCUMENTS

EP    2143816 A1    1/2010
EP    2631319 A1    8/2013
(Continued)

OTHER PUBLICATIONS

International Search Report of PCT/IB2018/058991, dated Feb. 15, 2019.
(Continued)

*Primary Examiner* — Seth Dumbris
(74) *Attorney, Agent, or Firm* — Davidson, Davidson & Kappel, LLC

(57) ABSTRACT

A steel sheet coated with a coating comprising from 10 to 40% of nickel, the balance being zinc, such steel sheet having a microstructure comprising from 1 to 50% of residual austenite, from 1 to 60% of martensite and optionally at least one element chosen from: bainite, ferrite, cementite and pearlite, and the following chemical composition in weight: 0.10<C<0.50%, 1.0<Mn<5.0%, 0.7<Si<3.0%, 0.05<Al<1.0%, 0.75<(Si+Al)<3.0% and on a
(Continued)

purely optional basis, one or more elements such as Nb≤0.5%, B≤0.005%, Cr≤1.0%, Mo≤0.50%, Ni≤1.0%, Ti≤0.5%, the remainder of the composition making up of iron and inevitable impurities resulting from the elaboration.

25 Claims, 1 Drawing Sheet

(51) Int. Cl.
| | |
|---|---|
| B32B 7/05 | (2019.01) |
| B23K 11/11 | (2006.01) |
| C21D 6/00 | (2006.01) |
| C21D 9/46 | (2006.01) |
| C22C 18/00 | (2006.01) |
| C22C 38/02 | (2006.01) |
| C22C 38/06 | (2006.01) |
| C22C 38/22 | (2006.01) |
| C22C 38/38 | (2006.01) |
| C23F 17/00 | (2006.01) |

(52) U.S. Cl.
CPC ............. *C21D 6/002* (2013.01); *C21D 6/005* (2013.01); *C21D 6/008* (2013.01); *C21D 9/46* (2013.01); *C22C 18/00* (2013.01); *C22C 38/02* (2013.01); *C22C 38/06* (2013.01); *C22C 38/22* (2013.01); *C22C 38/38* (2013.01); *C23F 17/00* (2013.01); *B32B 2250/02* (2013.01); *B32B 2605/08* (2013.01); *C21D 2211/001* (2013.01); *C21D 2211/002* (2013.01); *C21D 2211/005* (2013.01); *C21D 2211/008* (2013.01)

(56) References Cited

U.S. PATENT DOCUMENTS

| | | | |
|---|---|---|---|
| 10,272,514 | B2 | 4/2019 | Perlade et al. |
| 10,597,745 | B2 | 7/2020 | Drillet et al. |
| 2012/0009437 | A1* | 1/2012 | Tran ..................... B32B 15/015 |
| | | | 205/112 |
| 2012/0100391 | A1 | 4/2012 | Lee et al. |
| 2012/0164472 | A1 | 6/2012 | Kuhn et al. |
| 2013/0309758 | A1 | 11/2013 | Erasmus et al. |
| 2014/0241933 | A1* | 8/2014 | Haga ..................... C21D 1/673 |
| | | | 420/104 |
| 2014/0349133 | A1 | 11/2014 | Lee et al. |
| 2014/0370330 | A1 | 12/2014 | Sato et al. |
| 2015/0017471 | A1* | 1/2015 | Shuto ..................... C22C 38/26 |
| | | | 148/333 |
| 2015/0284819 | A1* | 10/2015 | Tamaki ................ C21D 8/0263 |
| | | | 148/330 |
| 2016/0082701 | A1 | 3/2016 | Kurosaki |
| 2016/0145704 | A1* | 5/2016 | Kawasaki ................ C21D 7/13 |
| | | | 148/330 |
| 2016/0151822 | A1 | 6/2016 | Nakajima et al. |
| 2016/0208355 | A1* | 7/2016 | Nakagaito ............. C21D 6/002 |
| 2017/0073792 | A1* | 3/2017 | Hikida ..................... C21D 9/46 |
| 2018/0371566 | A1* | 12/2018 | Gospodinova .......... C22C 38/02 |

FOREIGN PATENT DOCUMENTS

| | | | |
|---|---|---|---|
| EP | 3088557 | A | 11/2016 |
| JP | S589965 | | 1/1983 |
| JP | 2 561331 | B2 | 12/1996 |
| JP | 2004124187 | A | 4/2004 |
| JP | 2008144264 | A | 6/2008 |
| KR | 20120074144 | A | 7/2012 |
| KR | 20150073317 | A | 7/2015 |
| KR | 20160035015 | A | 3/2016 |
| KR | 20160096611 | A | 8/2016 |
| WO | 2014124749 | A1 | 8/2014 |
| WO | WO2017108896 | | 6/2017 |
| WO | WO-2017108897 | A1 * | 6/2017 ............... C21D 8/02 |
| WO | 2019082035 | A1 | 5/2019 |
| WO | 2019082036 | A1 | 5/2019 |
| WO | 2019082037 | A1 | 5/2019 |
| WO | 2019082038 | A1 | 5/2019 |

OTHER PUBLICATIONS

See International Search Report of PCT/IB2018/058158, dated Feb. 14, 2019.

See International Search Report of PCT/IB2018/058155, dated Dec. 21, 2018.

See International Search Report of PCT/IB2018/058154, dated Dec. 3, 2018.

* cited by examiner

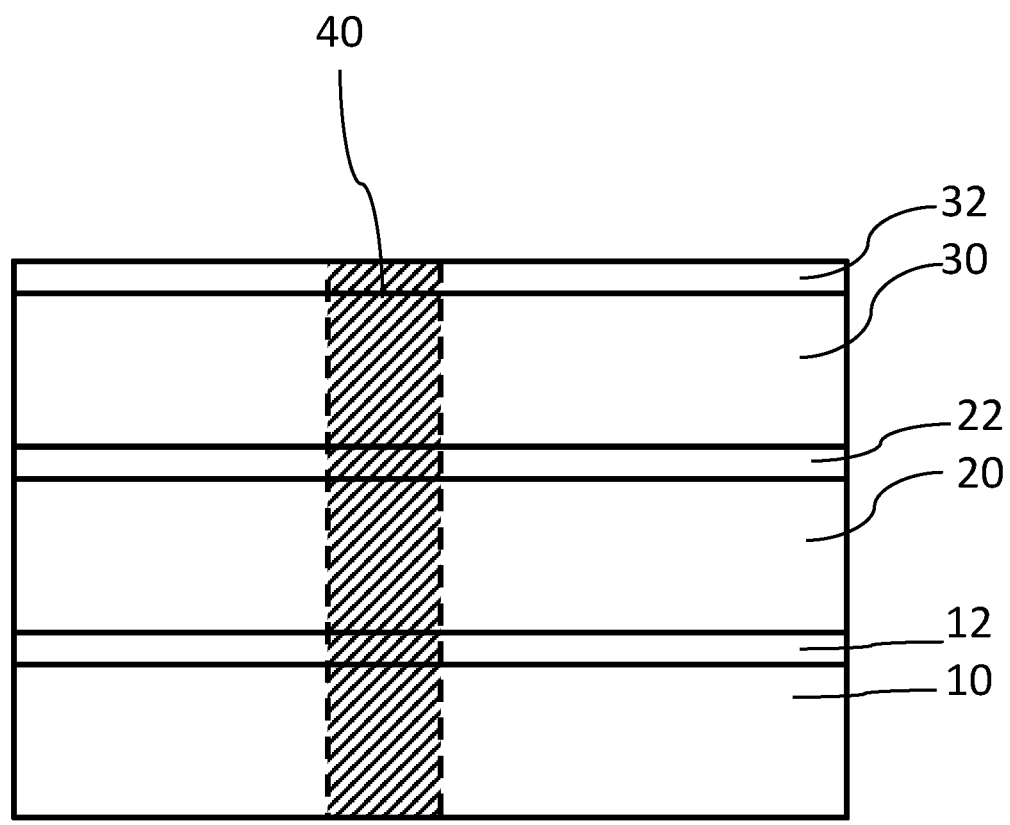

METHOD FOR THE MANUFACTURE OF A COATED STEEL SHEET

The present invention relates to a method for the manufacture of a coated steel sheet. The invention is particularly well suited for the manufacture of automotive vehicles.

BACKGROUND

Zinc based coatings are generally used because they allow for a protection against corrosion, thanks to barrier protection and cathodic protection. The barrier effect is obtained by the application of a metallic coating on steel surface. Thus, the metallic coating prevents the contact between steel and corrosive atmosphere. The barrier effect is independent from the nature of coating and substrate. On the contrary, sacrificial cathodic protection is based on the fact that zinc which is more active metal as compared to steel. Thus, if corrosion occurs, zinc is consumed preferentially to steel. Cathodic protection is essential in areas where steel is directly exposed to corrosive atmosphere, like cut edges where surrounding zinc will be consumed before steel.

However, when heating steps are performed on such zinc coated steel sheets, for example hot press hardening or welding, cracks are observed in steel which spread from the steel/coating interface. Indeed, occasionally, there is a reduction of metal mechanical properties due to the presence of cracks in coated steel sheet after the above operation. These cracks appear with the following conditions: high temperature; contact with a liquid metal having a low melting point (such as zinc) in addition to presence of an external stress; heterogeneous diffusion of molten metal with substrate grain and grain boundaries. The designation for such phenomenon is known as liquid metal embrittlement (LME) and also called liquid metal assisted cracking (LMAC).

SUMMARY OF THE INVENTION

It is an object of the present invention to provide a steel sheet coated with a metallic coating which does not have LME issues. It aims to make available, in particular, an easy to implement method in order to obtain a part which does not have LME issues after the forming and/or the welding.

The invention provides a steel sheet coated with a coating comprising from 10 to 40% of nickel, the balance being zinc, such steel sheet having a microstructure comprising from 1 to 50% of residual austenite, from 1 to 60% of martensite and optionally at least one element chosen from: bainite, ferrite, cementite and pearlite, and the following chemical composition in weight:

0.10<C<0.50%, 1.0<Mn<5.0%, 0.7<Si<3.0%, 0.05<Al<1.0%

0.75<(Si+Al)<3.0% and on a purely optional basis, one or more elements such as

Nb≤0.5%,

B≤0.005%,

Cr≤1.0%,

Mo≤0.50%,

Ni≤1.0%,

Ti≤0.5%, the remainder of the composition making up of iron and inevitable impurities resulting from the elaboration. In this case, the martensite can be tempered or untempered.

The present invention also provides a method for the manufacture of the coated steel sheet comprising the following steps:

A. The provision of an annealed steel sheet having the chemical composition according to the present invention, such steel sheet being annealed at a temperature between 600 to 1200° C. and B. the coating of the steel sheet obtained in step A) with a coating comprising from 1 to 40% of nickel, the balance being zinc.

The steel sheet or the spot welded joint according to the present invention can be used for the manufacture of parts for automotive vehicle.

Thus, a spot welded joint of at least two metal sheets, comprising the at least one coated steel sheet according to the present invention, is obtained, such said joint containing less than 2 cracks having a size above 100 µm and wherein the longest crack has a length below 250 µm.

Other characteristics and advantages of the invention will become apparent from the following detailed description of the invention.

BRIEF DESCRIPTION OF THE DRAWING

FIG. 1 shows schematically a non-limiting example of a spot welded joint with three steel sheets made according to the present invention.

DETAILED DESCRIPTION

The designation "steel" or "steel sheet" means a steel sheet, a coil, a plate having a composition allowing the part to achieve a tensile strength up to 2500 MPa and more preferably up to 2000 MPa. For example, the tensile strength is above or equal to 500 MPa, preferably above or equal to 980 MPa, advantageously above or equal to 1180 MPa and even above or equal 1470 MPa.

The invention relates to a steel sheet coated with a coating comprising from 10 to 40% of nickel, the balance being zinc, such steel sheet having a microstructure comprising from 1 to 50% of residual austenite, from 1 to 60% of martensite and optionally at least one element chosen from: bainite, ferrite, cementite and pearlite, and the following chemical composition in weight:

0.10<C<0.50%, 1.0<Mn<5.0%, 0.7<Si<3.0%, 0.05<Al<1.0%

0.75<(Si+Al)<3.0% and on a purely optional basis, one or more elements such as

Nb≤0.5%,

B≤0.005%,

Cr≤1.0%,

Mo≤0.50%,

Ni≤1.0%,

Ti≤0.5%, the remainder of the composition making up of iron and inevitable impurities resulting from the elaboration. In this case, the martensite can be tempered or untempered.

Without willing to be bound by any theory, it seems that the specific steel sheet coated with a coating comprising zinc and nickel according to the present prevents liquid zinc penetration into steel during any heating steps being for example a welding. Thus, by applying the method according to the present invention, it is possible to obtain zinc-nickel intermetallic compounds during above heating step. These intermetallic compounds have high melting temperature and remain solid during above heating step and thus prevents LME.

Preferably, the coating comprises from 10 to 30%, more preferably from 10 to 20% and advantageously from 11 to 15 wt. % by weight of nickel.

In a preferred embodiment, the coating consists of zinc and nickel.

Advantageously, the coating is directly in contact with the steel sheet.

Preferably, the coating has a thickness between 5 to 15 μm and more preferably between 5 to 10 μm.

In a preferred embodiment, the steel sheet has a microstructure comprising from 5 to 25% of residual austenite.

Preferably, the steel sheet has a microstructure comprising from 1 to 60% and more preferably between 10 to 60% of tempered martensite.

Advantageously, the steel sheet has a microstructure comprising from 10 to 40% of bainite, such bainite comprising from 10 to 20% of lower bainite, from 0 to 15% of upper bainite and from 0 to 5% of carbide free bainite.

Preferably, the steel sheet has a microstructure comprising from 1 to 25% of ferrite.

Preferably, the steel sheet has a microstructure comprising from 1 to 15% untempered martensite.

According to the present invention, the method for the manufacture of the coated steel sheet comprises the following steps:
  A. The provision of an annealed steel sheet having the chemical composition according to the present invention, such steel sheet being annealed at a temperature between 600 to 1200° C. and
  B. the coating of the steel sheet obtained in step A) with a coating comprising from 1 to 40% of nickel, the balance being zinc.

Preferably, in step A), the steel sheet is annealed in a continuous annealing. For example, the continuous annealing comprises a heating, a soaking and a cooling step. It can further comprise a pre-heating step.

Advantageously, the thermal treatment is performed in an atmosphere comprising from 1 to 30% of $H_2$ at a dew point between −10 and −60° C. For example, the atmosphere comprises from 1 to 10% of $H_2$ at a dew point between −10° C. and −60° C.

Preferably, the coating in step B) is deposited by vacuum deposition or electro-plating method. Advantageously, the coating is deposited by electro-plating method.

After the manufacture of a steel sheet, in order to produce some parts of a vehicle, it is known to assembly by welding two metal sheets. Thus, a spot welded joint is formed during the welding of at least two metal sheets, said spot being the link between the at least two metal sheets.

To produce a spot welded joint according to the invention, the welding is performed with an effective intensity is between 3 kA and 15 kA and the force applied on the electrodes is between 150 and 850 daN with said electrode active face diameter being between 4 and 10 mm.

Thus, a spot welded joint of at least two metal sheets, comprising the at least one coated steel sheet according to the present invention, is obtained, such said joint containing less than 2 cracks having a size above 100 μm and wherein the longest crack has a length below 250 μm.

Preferably, the second metal sheet is a steel sheet or an aluminum sheet. More preferably, the second metal sheet is a steel sheet according to the present invention.

In another embodiment, the spot welded joint comprises a third metal sheet being a steel sheet or an aluminum sheet. For example, the third metal sheet is a steel sheet according to the present invention. FIG. 1 thus shows schematically a spot weld 40 for joining three metal sheets each with a steel substrate 10, 20, 30, and coating 12, 22, 32, respectively.

The steel sheet or the spot welded joint according to the present invention can be used for the manufacture of parts for automotive vehicle.

The invention will now be explained in trials carried out for information only. They are not limiting.

Example

For all samples, steel sheets used have the following composition in weight percent:
  Steel sheet 1: C=0.37 wt. %, Mn=1.9 wt. %, Si=1.9 wt. %, Cr=0.35 wt. %, Al=0.05 wt. % and Mo=0.1% and
  Steel sheet 2: C=0.18 wt. %, Mn=2.7 wt. %, Al=0.05 wt. % and Si=1.8 wt. %.

Trials 1 to 4 were prepared by performing an annealing in a continuous annealing in an atmosphere comprising 5% of $H_2$ and 95% of $N_2$ at a dew point of −60° C. The steel 1 and steel 2 sheets were respectively heated at a temperature of 900° C. and 820° C. Then, Trials 1 and 2 sheets were coated with a coating comprising 13% of nickel, the balance being zinc. The coating was deposited by electro-deposition method.

For comparison purpose in Trials 3 and 4, pure zinc was electro-deposited on the sheet sheets 1 and 2 heat treated under above mentioned condition.

LME resistance of the above Trials were evaluated using resistance spot welding method. To this end, for each Trial, two coated steel sheets were welded together by resistance spot welding. The type of the electrode was ISO Type B with a diameter of 16 mm; the force of the electrode was of 5 kN and the flow rate of water of was 1.5 g/min. The details of welding cycle is shown in Table 1.

TABLE 1

| Welding schedule | | | | |
|---|---|---|---|---|
| Weld time | Pulses | Pulse (cy) | Cool time (cy) | Hold time (cy) |
| Cycle | 2 | 12 | 2 | 10 |

The number of cracks above 100 μm was then evaluated using an optical microscope as well as SEM (Scanning Electron Microscopy) as follows as reported in Table 2:

TABLE 2

LME crack details after spot welding (2 layer stack-up condition)

| Trials | coating | Sheet Steel | Thickness (μm) | Number of cracks (>100 μm) per spot weld | Maximum crack length (μm) |
|---|---|---|---|---|---|
| Trial 1* | Zn—Ni | 1 | 7 | 0 | 0 |
| Trial 2* | Zn—Ni | 2 | 7 | 0 | 0 |
| Trial 3 | Zn | 1 | 7 | 3 | 760 |
| Trial 4 | Zn | 2 | 7 | 2 | 250 |

*according to the present invention.

Trials 1 and 2 according to the present invention show an excellent resistance to LME compared to Trials 3 and 4.

The LME crack resistance behavior was also evaluated using 3 layer stack-up condition. For each Trial, three coated steel sheets were welded together by resistance spot welding. The number of cracks 100 μm was then evaluated using an optical microscope as reported in Table 3.

TABLE 3

LME crack details after spot welding (3 layer stack-up condition)

| Trials | Sheet Steel | Number of cracks per spot weld (>100 μm) | Maximum crack length (μm) |
|---|---|---|---|
| Trial 1* | 1 | 1 | 150 |
| Trial 2* | 2 | 0 | 200 |
| Trial 3 | 1 | 7 | 850 |
| Trial 4 | 2 | 3 | 350 |

*according to the present invention.

Trials 1 and 2 according to the present invention show an excellent resistance to LME compared to Trial 3 and 4.

What is claimed is:

1. A steel sheet comprising:
a steel substrate; and
a coating on the steel substrate, the coating comprising from 10 to 40% of nickel, a balance being zinc,
the steel substrate having a microstructure comprising from 1 to 50% of residual austenite, from 1 to 60% of martensite, from 10 to 40% of bainite, such bainite comprising from 10 to 20% of lower bainite, from 0 to 15% of upper bainite and from 0 to 5% of carbide free bainite, and optionally at least one element chosen from: ferrite, cementite and pearlite, and the following chemical composition in weight:

0.10<C<0.50%, 1.0<Mn<5.0%, 0.7<Si<3.0%, 0.05<Al<1.0%, 0.75<(Si+Al)<3.0%, and on a purely optional basis, one or more elements:

Nb≤0.5%,

B≤0.005%,

Cr≤1.0%,

Mo≤0.50%,

Ni≤1.0%,

Ti≤0.5%, a remainder of the composition making up of iron and inevitable impurities resulting from processing.

2. The steel sheet as recited in claim 1 wherein the coating includes from 10 to 30% by weight of nickel.

3. The steel sheet as recited in claim 2 wherein the coating includes from 10 to 20% by weight of nickel.

4. The steel sheet as recited in claim 3 wherein the coating consists of zinc and nickel.

5. The steel sheet as recited in claim 1 wherein the coating is directly in contact with the steel sheet.

6. The steel sheet as recited in claim 1 wherein the coating has a thickness between 5 to 15 μm.

7. The steel sheet as recited in claim 6 wherein the coating has a thickness between 5 to 10 μm.

8. The steel sheet as recited in claim 1 wherein the steel sheet microstructure includes from 5 to 25% of residual austenite.

9. The steel sheet as recited in claim 1 wherein the 1 to 60% of martensite includes from 1 to 60% of tempered martensite.

10. The steel sheet as recited in claim 1 wherein the steel sheet microstructure includes from 1 to 25% of ferrite.

11. The steel sheet as recited in claim 1 wherein the 1 to 60% of martensite includes from 1 to 15% of untempered martensite.

12. A spot welded joint of at least two metal sheets comprising: the steel sheet as recited in claim 1 and a second metal sheet, the joint containing less than 2 cracks having a size above 100 μm and wherein the longest crack has a length below 250 μm.

13. The spot welded joint as recited in claim 12 wherein the second metal sheet is a steel sheet or an aluminum sheet.

14. The spot welded joint as recited in claim 12 wherein the second metal sheet includes a second steel substrate; and a second coating on the second steel substrate, the second coating comprising from 10 to 40% of nickel, a balance being zinc, the second steel substrate having a microstructure comprising from 1 to 50% of residual austenite, from 1 to 60% of martensite and optionally at least one element chosen from: bainite, ferrite, cementite and pearlite, and the following chemical composition in weight:

0.10<C<0.50%, 1.0<Mn<5.0%, 0.7<Si<3.0%, 0.05<Al<1.0%, 0.75<(Si+Al)<3.0%, and on a purely optional basis, one or more elements:

Nb≤0.5%,

B≤0.005%,

Cr≤1.0%,

Mo≤0.50%,

Ni≤1.0%,

Ti≤0.5%, a remainder of the composition making up of iron and inevitable impurities resulting from processing.

15. The spot welded joint as recited in claim 12 further comprising a third metal sheet being a steel sheet or an aluminum sheet.

16. The spot welded joint as recited in claim 12 wherein the joint contains no cracks having a size above 100 µm.

17. An automobile vehicle part comprising the steel sheet as recited in claim 1.

18. A method for the manufacture of a coated steel sheet according to claim 1, comprising the following steps:
   providing an annealed steel substrate having the following chemical composition in weight:

0.10<C<0.50%, 1.0<Mn<5.0%, 0.7<Si<3.0%, 0.05<Al<1.0%, 0.75<(Si+Al)<3.0%, and on a purely optional basis, one or more elements:

Nb≤0.5%,

B≤0.005%,

Cr≤1.0%,

Mo≤0.50%,

Ni≤1.0%,

Ti≤0.5%, such steel sheet being annealed at a temperature between 600 to 1200° C.;
   the steel substrate having a microstructure comprising from 1 to 50% of residual austenite, from 1 to 60% of martensite, from 10 to 40% of bainite, such bainite comprising from 10 to 20% of lower bainite, from 0 to 15% of upper bainite and from 0 to 5% of carbide free bainite, and optionally at least one element chosen from: ferrite, cementite and pearlite; and
   coating the annealed steel substrate with a coating comprising from 1 to 40% of nickel, a balance being zinc.

19. A spot welded joint of at least two metal sheets comprising: the coated steel sheet obtained from the method as recited in claim 18 and a second metal sheet, the joint containing less than 2 cracks having a size above 100 µm and wherein the longest crack has a length below 250 µm.

20. The method as recited in claim 18 wherein the steel substrate is annealed in a continuous annealing.

21. The method as recited in claim 18 wherein the annealing is performed in an atmosphere comprising from 1 to 30% of $H_2$ at a dew point between −10 and −60° C.

22. The method as recited in claim 18 wherein the coating is deposited by vacuum deposition or an electro-plating method.

23. The method as recited in claim 22 wherein the coating is deposited by the electro-plating method.

24. An automobile vehicle part comprising a coated steel sheet obtained by the method as recited in claim 18.

25. The steel sheet as recited in claim 1 wherein the steel sheet microstructure comprises from 5 to 25% of residual austenite and from 1 to 25% of ferrite.

* * * * *